United States Patent [19]

Ochi et al.

[11] Patent Number: 5,015,558

[45] Date of Patent: May 14, 1991

[54] HIGH ENERGY BEAM-SENSITIVE COPOLYMER

[75] Inventors: Hideo Ochi; Tomoyuki Kitaori, both of Misato, Japan

[73] Assignee: Somar Corporation, Japan

[21] Appl. No.: 391,035

[22] Filed: Aug. 9, 1989

[30] Foreign Application Priority Data

Aug. 11, 1988 [JP]  Japan ................. 63-200540

[51] Int. Cl.$^5$ ................ C03C 5/00; C08F 16/26; C08F 8/18; C08F 18/00
[52] U.S. Cl. ..................... 430/325; 430/270; 525/330.6; 525/327.3; 525/328.8; 525/359.4; 525/330.3; 525/328.9; 526/292.3; 526/292.4
[58] Field of Search ................ 430/270, 325; 525/330.6, 327.3, 328.8, 359.4, 330.3, 328.9; 526/292.4, 292.3

[56] References Cited

U.S. PATENT DOCUMENTS

| | | | |
|---|---|---|---|
| 2,857,354 | 10/1958 | Fang | 525/327.3 |
| 3,162,613 | 12/1964 | Tousignant | 526/292.3 |
| 4,262,081 | 4/1981 | Bowden et al. | 430/280 |
| 4,367,281 | 1/1983 | Shibayama et al. | 430/270 |
| 4,535,054 | 8/1985 | Brault et al. | 430/270 |
| 4,636,458 | 1/1987 | Wenzel et al. | 430/270 |

FOREIGN PATENT DOCUMENTS 58-168047  10/1983  Japan ................. 430/325

OTHER PUBLICATIONS

Patent Abstracts of Japan, vol. 8, No. 6, (P-247) (1443), Jan. 12, 1984.

*Primary Examiner*—Charles L. Bowers, Jr.
*Assistant Examiner*—John S. Y. Chu
*Attorney, Agent, or Firm*—Lorusso & Loud

[57] ABSTRACT

A novel copolymer containing a plurality of first and second monomer units having the following general formulas (I) and (II), respectively:

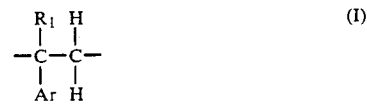

(I)

wherein $R_1$ stands for hydrogen or methyl and Ar stands for an aryl,

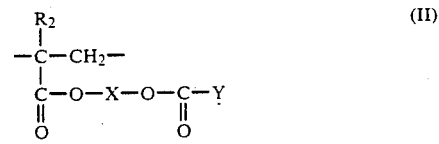

(II)

wherein $R_2$ stands for hydrogen or methyl and X stands for $-CH_2CH_2-$, $-CH_2CH(OH)CH_2-$ or $-CH_2CH(CH_2OH)-$ and Y stands for o- or p-chlorophenyl, the molar ratio of the first monomer unit to the second monomer unit being 94:6 to 98:2. The copolymer becomes insoluble to a developing liquid when exposed to high energy radiations and is used for forming resist pattern on a silicon wafer or the like substrate.

3 Claims, No Drawings

HIGH ENERGY BEAM-SENSITIVE COPOLYMER

This invention relates generally to a novel polymer sensitive to a high energy beam and, more specifically, to a copolymer to be used for the formation of resist patterns on a substrate such as a silicon wafer. The present invention is also directed to a process for forming a fine resist pattern on such a substrate using the above copolymer.

One known method for the production of a fine resist pattern on a substrate includes the steps of:
applying a coating liquid containing a light sensitive polymer to a surface of the substrate and drying same to form a layer;
exposing the layer to high energy radiations under a mask pattern so that the exposed areas of the layer become insoluble in a developing liquid;
immersing the exposed layer in the developing liquid to remove the unexposed areas from the substrate, thereby to leave a fine resist pattern corresponding to the mask pattern.

Japanese Published Unexamined patent application (Tokkyo Kokai) No. 58-168047 discloses a light sensitive material useful for application to the above method for the formation of the resist pattern and containing a copolymer of (a) 20-90 mole % of an aromatic vinyl monomer such as styrene and (b) another vinyl monomer containing a chlorinated benzoic acid residue such as 2,4-dichlorobenzoic acid ester of glycidyl methacrylate. This copolymer exhibits a high sensitivity to a deep UV or an electron beam.

It has been found, however, that the copolymer fails to provide a good resolving power so that the resist pattern obtained therefrom lacks sharpness. More particularly, with the conventional copolymer, there are formed whisker or bridges of the insolubilized copolymer extending from the edge of the resist pattern due to swelling of the copolymer during the immersion in the developing liquid.

The present invention has been made to solve the above problem and is aimed at the provision of a novel copolymer having a high sensitivity to a high energy beam such as a deep UV ray, an electron beam or an X-ray, and capable of providing a resist pattern having a high resolving power.

In accordance with one aspect of the present invention there is provided a copolymer sensitive to a high energy beam and containing a plurality of first and second monomer units having the following general formulas (I) and (II), respectively:

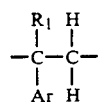
(I)

wherein $R_1$ stands for hydrogen or methyl and Ar stands for an aryl,

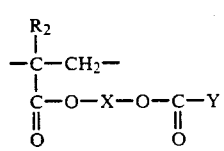
(II)

wherein $R_2$ stands for hydrogen or methyl and X stands for $-CH_2CH_2-$, $-CH_2CH(OH)CH_2-$ or $-CH_2CH(CH_2OH)-$ and Y stands for o- and/or p-chlorophenyl, the molar ratio of the first monomer unit to the second monomer unit being 94:6 to 98:2.

In another aspect, the present invention provides a copolymer sensitive to a high energy beam and obtained by a method comprising the steps of:
providing a copolymer containing a plurality of first and second monomer units having the following general formulas (I) and (III), respectively:

(I)

wherein $R_1$ stands for hydrogen or methyl and Ar stands for an aryl,

(III)

wherein $R_2$ stands for hydrogen or methyl and Z stands for hydroxyethyl or glycidyl, the molar ratio of the first monomer unit to the second monomer unit being 94:6 to 98:2; and
reacting the copolymer with o- and/or p-chlorobenzoic acid to esterify the hydroxyl or epoxy group of each of said second monomer units with said acid.

In a further aspect, the present invention provides a process for the production of a fine resist pattern on a semiconductor substrate, comprising the steps of:
providing a solution of a copolymer sensitive to a high energy beam and containing a plurality of first and second monomer units having the following general formulas (I) and (II), respectively:

(I)

wherein $R_1$ stands for hydrogen or methyl and Ar stands for an aryl,

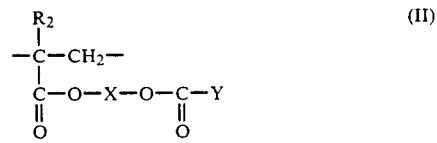
(II)

wherein $R_2$ stands for hydrogen or methyl and X stands for $-CH_2CH_2-$, $-CH_2CH(OH)CH_2-$ or $-CH_2CH(CH_2OH)-$ and Y stands for o- and/or p-chlorophenyl, the molar ratio of the first monomer unit the second monomer unit being 94:6 to 98:2;
applying said solution to a surface of the substrate and drying same to form a layer with a thickness of 0.4-1 um on the substrate;
exposing said layer to high energy radiations so that the exposed areas of said layer become insoluble in a developing liquid;

immersing said exposed layer in the developing liquid to remove the unexposed areas from the substrate, thereby to leave a fine resist pattern corresponding to said exposed areas.

The present invention will now be described in detail below.

The novel copolymer according to the present invention contains a plurality of first and second monomer units having the following general formulas (I) and (II), respectively:

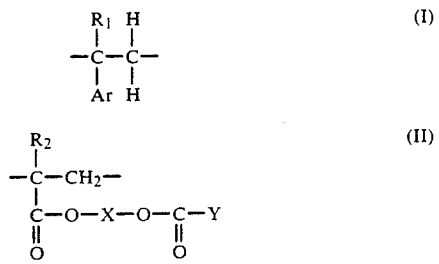

wherein $R_1$ and $R_2$ stand independently from each other for hydrogen or methyl, Ar stands for an aryl, X stands for $-CH_2CH_2-$, $-CH_2CH(OH)CH_2-$ or $-CH_2CH(CH_2OH)-$ and Y stands for o- and/or p-chlorophenyl.

It is important that the molar ratio of the monomer unit (I) to the monomer unit (II) in the copolymer should be in the range of 94:6 to 98:2. When the molar ratio becomes higher than 98:2, i.e. when the proportion of the monomer unit (II) becomes smaller than 2 mole %, desired sensitivity cannot be obtained. On the other hand, too low a molar ratio below 94:6, i.e. too large a proportion of the monomer unit (II) in excess of 6 mole %, causes lowering of the resolving power. Very good results with respect to both sensitivity and resolving power may be obtained with the molar ratio of the monomer unit (I) to monomer unit (II) in the range of 95:5 to 97:3 and this range is a preferred one.

It is also important that the symbol Y of the monomer unit of the formula (II) should be o-chlorophenyl and/or p-chlorophenyl. Other halogens than chlorine are not suited for the purpose of the present invention. Further, the use of m-chlorophenyl or 2,4-dichlorophenyl as the symbol Y cannot attain the objects of the present invention. The copolymer according to the present invention generally has a number average molecular weight of 5,000-200,000, preferably 19,000-120,000.

The copolymer may be prepared by, for example, copolymerizing an aromatic vinyl monomer providing the first monomer unit of the formula (I) with another monomer providing the second monomer unit of the formula (II). Examples of the monomers providing the first monomer unit of the formula (I) include styrene, alpha-methylstyrene, vinyltoluene and vinylnaphthalene. Examples of the monomers providing the second monomer unit of the formula (II) include glycidyl methacrylate, glycidyl acrylate, 2-hydroxyethyl methacrylate and 2-hydroxyethyl acrylate having their functional groups (i.e. epoxy group and hydroxyl group) modified with o- or p-chlorobenzoic acid.

Alternatively, the copolymer may be obtained by first copolymerizing the above aromatic vinyl monomer with another monomer such as glycidyl methacrylate, glycidyl acrylate, 2-hydroxyethyl methacrylate or 2-hydroxyethyl acrylate, and then reacting the resultant copolymer with o- or p-chlorobenzoic acid.

The copolymer according to the present invention is sensitive to a high energy beam such as an electron beam at an acceleration voltage of 10-50 KV, an X-ray having a wavelength of 1-20 Å or a UV ray having a wavelength of 2000-3000 Å and, therefore, suitably utilized as a fine resist pattern forming resin to be used in electron beam lithography, X-ray lithography or deep UV lithography.

Such a resist pattern can be obtained in the following manner. The copolymer of the present invention is dissolved in a suitable solvent such as ethylene glycol monomethyl ether acetate and the solution is uniformly coated over a substrate such as a silicon wafer using a spinner. The coated layer is dried to form a polymer layer having a thickness of 0.4-1 μm. The polymer layer is then subjected to high energy irradiations using, for example, a xenon/mercury lamp emanating UV rays of a wavelength of 2,000-3,000 Å through a mask pattern provided on a substrate such as a synthetic quarz, so that the exposed areas of the polymer layer become insoluble in a developing liquid. The resultant layer is then immersed in the developing liquid, such as a mixed liquid containing methyl ethyl ketone and ethanol, to remove the unexposed areas from the substrate, thereby to leave a fine, high resolution resist pattern corresponding to the mask pattern.

The novel copolymer according to the present invention is substantially insensitive to visible light. Therefore, it can be dealt with under roomlight. Further, the copolymer is stable against damp and heat and has a long shelf life.

The following examples will further illustrate the present invention.

PREPARATION OF COPOLYMERS

EXAMPLE 1

A styrene/glycidyl methacrylate copolymer (number average molecular weight: 111,000) composed of 95 mole % of styrene monomer units and 5 mole % of glycidyl methacrylate monomer units was prepared in the conventional manner. This copolymer (6 g) was dissolved in 100 ml of 2-methoxyethyl acetate together with 3.8 g of p-chlorobenzoic acid. To the solution was further added 0.5 g of tetraethylbenzylammonium chloride and the mixture was reacted at 96° C for 4 hours with stirring. The reaction mixture was allowed to be cooled to room temperature and was then poured into isopropyl alcohol to obtain 6.1 g of a solid polymer product.

This product was analyzed by IR spectroscopy, elementary analysis and epoxy group quantitative analysis (hydrochloric acid/DMF method) to reveal that no residual epoxy groups were detected and that stoichiometric amount of the p-chlorobenzoic acid was reacted with the epoxy group. The gel permeation chromatogram showed that the polymer had a number average molecular weight of 119,000.

EXAMPLE 2

Example 1 was repeated in the same manner as described except that o-chlorobenzoic acid was used in lieu of p-chlorobenzoic acid. The resulting polymer product had a number average molecular weight of 119,000.

EXAMPLE 3

Example 1 was repeated in the same manner as described except that a styrene/glycidyl methacrylate copolymer (number average molecular weight: 105,000) composed of 97 mole % of styrene monomer units and 3 mole % of glycidyl methacrylate monomer units was used as the starting material. The resulting polymer product had a number average molecular weight of 110,000.

EXAMPLE 4

Example 3 was repeated in the same manner as described except that o-chlorobenzoic acid was used in lieu of p-chlorobenzoic acid. The resulting polymer product had a number average molecular weight of 110,000.

EXAMPLE 5

Example 1 was repeated in the same manner as described except that a styrene/glycidyl methacrylate copolymer (number average molecular weight: 182,000) composed of 95 mole % of styrene monomer units and 5 mole % of glycidyl methacrylate monomer units was used as the starting material. The resulting polymer product had a number average molecular weight of 195,000.

EXAMPLE 6

Example 5 was repeated in the same manner as described except that o-chlorobenzoic acid was used in lieu of p-chlorobenzoic acid. The resulting polymer product had a number average molecular weight of 195,000.

EXAMPLE 7

Example 1 was repeated in the same manner as described except that a styrene/glycidyl methacrylate copolymer (number average molecular weight: 18,000) composed of 95 mole % of styrene monomer units and 5 mole % of glycidyl methacrylate monomer units was used as the starting material. The resulting polymer product had a number average molecular weight of 19,000.

EXAMPLE 8

Example 7 was repeated in the same manner as described except that o-chlorobenzoic acid was used in lieu of p-chlorobenzoic acid. The resulting polymer product had a number average molecular weight of 19,000.

COMPARATIVE EXAMPLE 1

Example 5 was repeated in the same manner as described except that 2,4-dichlorobenzoic acid was used in lieu of p-chlorobenzoic acid. The resulting polymer product had a number average molecular weight of 195,000.

COMPARATIVE EXAMPLE 2

Comparative Example 1 was repeated in the same manner as described except that a styrene/glycidyl methacrylate copolymer (number average molecular weight: 192,000) composed of 90 mole % of styrene monomer units and 10 mole % of glycidyl methacrylate monomer units was used as the starting material. The resulting polymer product had a number average molecular weight of 220,000.

COMPARATIVE EXAMPLE 3

Comparative Example 1 was repeated in the same manner as described except that a styrene/glycidyl methacrylate copolymer (number average molecular weight: 105,000) composed of 90 mole % of styrene monomer units and 10 mole % of glycidyl methacrylate monomer units was used as the starting material. The resulting polymer product had a number average molecular weight of 120,000.

COMPARATIVE EXAMPLE 4

Comparative Example 3 was repeated in the same manner as described except that p-chlorobenzoic acid was used in lieu of 2,4-dichlorobenzoic acid. The resulting polymer product had a number average molecular weight of 120,000.

COMPARATIVE EXAMPLE 5

Comparative Example 4 was repeated in the same manner as described except that o-chlorobenzoic acid was used in lieu of p-chlorobenzoic acid. The resulting polymer product had a number average molecular weight of 120,000.

COMPARATIVE EXAMPLE 6

Comparative Example 4 was repeated in the same manner as described except that a styrene/glycidyl methacrylate copolymer (number average molecular weight: 87,000) composed of 80 mole % of styrene monomer units and 20 mole % of glycidyl methacrylate monomer units was used as the starting material. The resulting polymer product had a number average molecular weight of 115,000.

COMPARATIVE EXAMPLE 7

Comparative Example 4 was repeated in the same manner as described except that a styrene/glycidyl methacrylate copolymer (number average molecular weight: 81,000) composed of 70 mole % of styrene monomer units and 30 mole % of glycidyl methacrylate monomer units was used as the starting material. The resulting polymer product had a number average molecular weight of 120,000.

FORMATION OF RESIST PATTERN ON SILICON SUBSTRATE

EXAMPLE 9

Each of the copolymers (1.5 g) obtained in Examples 1-8 was dissolved in 20 ml of 2-methoxyethyl acetate to obtain a coating liquid having a viscosity of 20 Cp at 25° C. The coating liquid was applied on a silicon substrate by a spin coating method and the coat was dried at 120° C. for 1 hour to obtain a resist layer having a thickness of 0.58 $\mu$m. Then an electron beam was irradiatd on the resist layer using an electron beam lithographic machine (ELS-3300 manufactured by Elyonics Inc.) at an acceleration voltage of 10 KV. The exposed layer was immersed in a mixed developing liquid consisting of 2 parts by volume of methyl ethyl ketone (MEK) and 1 part by volume of isopropyl alcohol (IPA) to dissolve the unexposed areas of the resist layer. The thus treated layer was washed with a 1:1 (vol/vol) mixed MEK/IPA liquid to obtain a resist pattern developed on the silicon substrate and formed of the exposed, insolubilized copolymer.

The sensitivity of the copolymer to the electron beam was evaluated in terms of the amount of electric charge required for insolubilizing the copolymer to such an extent that 50 % of the original thickness of the resist layer remained undissolved upon immersion in the developing liquid ($Dg^{0.5}$).

The resolving power of the copolymer resist layer was evaluated as follows.

A resist pattern of insolubilized copolymer is formed so that straight, grooved lines each having a gap of 1.5 μm are formed. The edge of the grooves is observed by scanning electron microscope for evaluating the degree of formation of "whisker" or bridges of the insolubilized copolymer. The evaluation is rated as follows:

A: substantially no whisker or bridges are observed
B: whisker or bridges are slightly observed
C: whisker or bridges are fairly observed
D: considerable amount of whisker or bridges are observed The results are shown in Table 1.

COMPARATIVE EXAMPLE 8

Copolymers of Comparative Examples 1–7 are tested for their sensitivity and resolution power in the same manner as that in Example 9. The results are shown in Table 1.

TABLE 1

| Example No. | Copolymer Styrene content (mole %) | Number average molecular weight ($\times 10^4$) | Benzoic acid residue | Sensitivity ($\mu c/cm^2$) | Resolution power |
|---|---|---|---|---|---|
| 1 | 95 | 11.9 | p-chloro | 1.2 | A |
| 2 | 95 | 11.9 | o-chloro | 0.95 | A |
| 3 | 97 | 11 | p-chloro | 1.5 | A |
| 4 | 97 | 11 | o-chloro | 1.1 | A |
| 5 | 95 | 19.5 | p-chloro | 0.55 | B |
| 6 | 95 | 19.5 | o-chloro | 0.70 | B |
| 7 | 95 | 1.9 | p-chloro | 12.4 | A |
| 8 | 95 | 1.9 | o-chloro | 9.8 | A |
| Comp. 1 | 95 | 19.5 | 2,4-dichloro | 0.49 | C |
| Comp. 2 | 90 | 22 | 2,4-dichloro | 0.40 | D |
| Comp. 3 | 90 | 12 | 2,4-dichloro | 0.77 | D |
| Comp. 4 | 90 | 12 | p-chloro | 1.1 | C |
| Comp. 5 | 90 | 12 | o-chloro | 0.87 | C |
| Comp. 6 | 80 | 11.5 | p-chloro | 1.1 | D |
| Comp. 7 | 70 | 12 | o-chloro | 1.1 | D |

EXAMPLE 10

The copolymer obtained in Example 6 was dissolved in 2-methoxyethyl acetate and the solution was applied on a silicon substrate having an oxide film with a thickness of 5000 Å. The coat was dried and baked at 120° C. for 1 hour to obtain a resist layer having a thickness of 1 μm. Then an X-ray was irradiated on the resist layer through a line and space form mask pattern (gap width: 0.5 μm). The irradiated layer was immersed in a mixed MEK/IPA developing liquid as used in Example 9 to dissolve the unirradiated areas, thereby to obtain a negative resist pattern developed on the silicon substrate and formed of the insolubilized copolymer. The sensitivity $Dg^{0.5}$ was found to be 30 mj/cm$^2$ for AlKα ray (wavelength 8.3 Å) and 200 mj/cm$^2$ for PDLα ray (wavelength 4.4 Å). It was further confirmed the resist pattern strictly corresponded to the mask pattern.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all the changes which come within the meaning and range of equivalency of the claims are therefore intended to be embraced therein.

We claim:

1. A copolymer sensitive to a high energy beam and containing a plurality of first and second monomer units having the following general formulas (I) and (II), respectively:

wherein $R_1$ stands for hydrogen or methyl and Ar stands for an aryl,

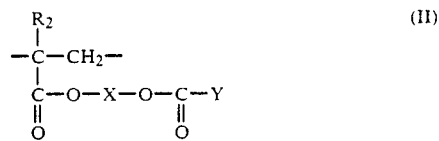

wherein $R_2$ stands for hydrogen or methyl and X stands for —$CH_2$—, —$CH_2CH(OH)CH_2$— or —$CH_2CH(CH_2OH)$— and Y stands for o- or p-chlorophenyl, the molar ratio of the first monomer unit to the second monomer unit being 94:6 to 98:2.

2. A copolymer sensitive to a high energy beam and obtained by a method comprising the steps of:

providing a copolymer containing a plurality of first and second monomer units having the following general formulas (I) and (II), respectively:

wherein $R_1$ stands for hydrogen or methyl and Ar stands for an aryl,

wherein $R_2$ stands for hydrogen or methyl and Z stands for hydroxyethyl or glycidyl, the molar ratio of the first monomer unit to the second monomer unit being 94:6 to 98:2; and reacting the copolymer with o- and/or p-chlorobenzoic acid to esterify the hydroxyl or epoxy group of each of said second monomer units with said acid.

3. A process for the production of a fine resist pattern on a semiconductor substrate, comprising the steps of:

providing a solution of a copolymer sensitive to a high energy beam and containing a plurality of first and second monomer units having the following general formulas (I) and (II), respectively:

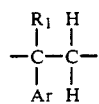
(I)

wherein $R_1$ stands for hydrogen or methyl and Ar stands for an aryl,

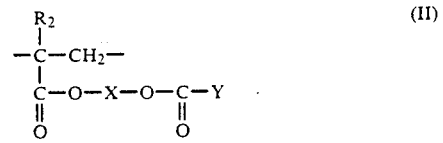

wherein $R_2$ stands for hydrogen or methyl and X stands for $-CH_2CH_2-$, $-CH_2CH(OH)CH_2-$ or $-CH_2CH(CH_2OH)-$ and Y stands for o- or p-chlorophenyl, the molar ratio of the first monomer unit to the second monomer unit being 94:6 to 98:2;

applying said solution to a surface of the substrate and drying same to form a layer with a thickness of 0.4–1 μm on the substrate;

exposing said layer to high energy radiations so that the exposed areas of said layer become insoluble in a developing liquid;

immersing said exposed layer in the developing liquid to remove the unexposed areas from the substrate, thereby to leave a fine resist pattern corresponding to said exposed areas.

* * * * *

UNITED STATES PATENT AND TRADEMARK OFFICE
CERTIFICATE OF CORRECTION

PATENT NO. : 5,015,558
DATED : May 14, 1991
INVENTOR(S) : OCHI et al

It is certified that error appears in the above-identified patent and that said Letters Patent is hereby corrected as shown below:

IN THE CLAIMS:

Col. 8, line 34, delete "-$CH_2$-" and insert -- -$CH_2CH_2$- --.

Signed and Sealed this

Fifteenth Day of December, 1992

Attest:

DOUGLAS B. COMER

*Attesting Officer*   *Acting Commissioner of Patents and Trademarks*